United States Patent
Aldinger et al.

(10) Patent No.: US 10,180,446 B2
(45) Date of Patent: Jan. 15, 2019

(54) DEVICE AND METHOD FOR DETERMINING A VOLTAGE

(71) Applicant: Robert Bosch GmbH, Stuttgart (DE)

(72) Inventors: Stefan Aldinger, Bad Wimpfen (DE); Joerg Koniakowsky, Ostfildern (DE); Tobias Richter, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/320,390

(22) PCT Filed: Apr. 22, 2015

(86) PCT No.: PCT/EP2015/058673
§ 371 (c)(1),
(2) Date: Dec. 20, 2016

(87) PCT Pub. No.: WO2015/193004
PCT Pub. Date: Dec. 23, 2015

(65) Prior Publication Data
US 2017/0138987 A1    May 18, 2017

(30) Foreign Application Priority Data

Jun. 20, 2014 (DE) .................. 10 2014 211 854

(51) Int. Cl.
*G01R 19/22* (2006.01)
*G01R 15/18* (2006.01)
(Continued)

(52) U.S. Cl.
CPC ....... *G01R 15/183* (2013.01); *G01R 19/0084* (2013.01); *G01R 19/16538* (2013.01); *G01R 19/2509* (2013.01); *G01R 31/40* (2013.01)

(58) Field of Classification Search
CPC .... G01R 15/18; G01R 15/183; G01R 19/165; G01R 19/25; G01R 19/16538;
(Continued)

(56) References Cited

U.S. PATENT DOCUMENTS

| 5,798,913 A | 8/1998 | Tiesinga et al. |
| 6,396,716 B1 * | 5/2002 | Liu .................. H02M 3/33569 363/132 |

(Continued)

FOREIGN PATENT DOCUMENTS

| WO | 2011067073 | 6/2011 |
| WO | 2014049279 | 4/2014 |

OTHER PUBLICATIONS

International Search Report for Application No. PCT/EP2015/058673 dated Jun. 25, 2015 (English Translation, 3 pages).

*Primary Examiner* — Thang X Le
(74) *Attorney, Agent, or Firm* — Michael Best & Friedrich LLP

(57) ABSTRACT

The invention relates to a device and to a method for determining a voltage. The voltage to be determined is a direct voltage at the input of a flyback converter. The flyback converter comprises at least a flyback-converter transformer and a switching element on the primary side of the flyback-converter transformer. In order to determine the voltage at the input of the flyback converter, a voltage on the secondary side of the flyback-converter transformer is sensed and evaluated in correlation with the switching state of the switching element on the primary side.

9 Claims, 4 Drawing Sheets

(51) Int. Cl.
*G01R 31/40* (2014.01)
*G01R 19/00* (2006.01)
*G01R 19/165* (2006.01)
*G01R 19/25* (2006.01)

(58) Field of Classification Search
CPC ... G01R 19/2509; G01R 31/40; H02M 3/335; H02M 3/33507; H02M 3/33538; H02M 3/33523; H02M 3/33584
See application file for complete search history.

(56) References Cited

U.S. PATENT DOCUMENTS

| | | | |
|---|---|---|---|
| 9,093,911 B2 * | 7/2015 | Telefus | H02M 3/33576 |
| 2004/0239513 A1 | 12/2004 | Lomax et al. | |
| 2005/0197791 A1 * | 9/2005 | Matsumoto | G03G 15/5004 |
| | | | 702/60 |
| 2009/0289557 A1 * | 11/2009 | Itoh | H05B 41/2882 |
| | | | 315/127 |
| 2011/0026275 A1 | 2/2011 | Huang et al. | |

* cited by examiner

DEVICE AND METHOD FOR DETERMINING A VOLTAGE

BACKGROUND OF THE INVENTION

The present invention relates to a device and a method for determining a voltage. In particular, the present invention relates to a method and a device for measuring a voltage in the intermediate circuit of a current converter of an electric drive system.

In electric drive systems of the type used, for example, in electrically driven motor vehicles, it is expected that the measurement of the output voltage of the traction battery or of the voltage in the intermediate circuit of an electric current converter takes place multiple times, for safety reasons. The voltage measurement takes place in the battery management system and at all consumers located on the intermediate circuit of the current converter, such as, for example, pulse-controlled inverters, DC-DC converters, and further electrified secondary units. As a rule, circuits for voltage detection divide the intermediate-circuit voltage across multiple stages in order to obtain a partial voltage which is detectable by a microcontroller. The detected signal is also converted from analog to digital, if necessary, for further conditioning, and is transferred from the high-voltage side to the low-voltage side via a galvanic isolating module.

The German patent application DE 10 2009 056 838 A1 discloses the measurement of a voltage in the intermediate circuit of a converter, wherein the voltage to be measured is used for charging at least one capacitor, for example, an intermediate-circuit capacitor. The capacitor is brought from a first state of charge into a second state of charge, and the charging time that was required is evaluated in order to determine the voltage to be measured.

Due to the strict requirements for the exact voltage detection, components having very low tolerances must be utilized for the voltage measurement. Such components are relatively expensive.

There is a demand for cost-effective, precise, and space-saving voltage detection. In particular, there is a demand for cost-effective and precise voltage detection for measuring voltage in the intermediate circuit of an electric drive system.

SUMMARY OF THE INVENTION

In this case, the present invention provides, in a first aspect, a device for determining a voltage, said device comprising a flyback converter having a flyback-converter transformer and a switching element, and comprising a voltage sensor, wherein the flyback-converter transformer has a primary side and a secondary side, the switching element is arranged on the primary side of the flyback-converter transformer, and the voltage sensor is arranged on the secondary side of the flyback-converter transformer and is designed for sensing a voltage depending on a switching state of the switching element.

According to a further aspect, the present invention provides a method for determining a voltage, which includes the steps of providing a flyback converter having a flyback-converter transformer and a switching element, wherein the flyback-converter transformer has a primary side and a secondary side, and the switching element is arranged on the primary side of the flyback-converter transformer; actuating the switching element; sensing a secondary voltage on the secondary side of the flyback-converter transformer; and, using the sensed secondary voltage, calculating a primary voltage which corresponds to a voltage on the primary side of the flyback-converter transformer.

The present invention is based on the concept of using a flyback converter for determining the voltage on the high-voltage side of an electric drive system and evaluating the voltage on the low-voltage side of the flyback converter in order to infer the voltage ratios on the high-voltage side. Flyback converters of this type are typically already present in electric drive systems. They are used, for example, for providing a supply voltage for the control elements of the electric drive system. Therefore, by making a minor modification to a pre-existing flyback converter of this type, a cost-effective and precise determination of the voltage ratios on the high-voltage side of the electric drive system can take place. Due to the integration of the voltage measurement in a flyback converter, which is already available as part of the voltage supply for the control electronics of the electric drive system, a separate circuit for the voltage measurement can be dispensed with.

The use of a few simple components and the use of pre-existing components for determining the intermediate-circuit voltage in the traction network allows for a cost-effective and space-saving voltage measurement of the battery voltage or the intermediate-circuit voltage. If this indirect measuring method is combined, via a flyback circuit, with the traditional measuring method via voltage-dividing chains, the voltage can be measured in two different ways. As a result, an additional safety advantage for the entire system is achieved.

According to one embodiment, the voltage sensor is designed for sensing the voltage when the switching element on the primary side of the flyback-converter transformer is closed. In this switching state, an electric current flows, on the primary side of the flyback-converter transformer, from the battery or the intermediate circuit through the flyback-converter transformer, and a proportional voltage is output on the secondary side of the flyback-converter transformer corresponding to the transfer ratio of the flyback-converter transformer. Therefore, in this switching state, it is very easy to infer the voltage of the battery or of the intermediate circuit on the primary side of the flyback-converter transformer.

According to one embodiment, the voltage sensor is designed for sensing the voltage when the switching element has been closed at least for a predetermined time period. If the voltage measurement on the secondary side is delayed by this predetermined time period after the switching element is switched on, transient reactions can die out within this predetermined time period and the voltage measurement is not disrupted or falsified by transient reactions of this type.

According to one embodiment, the voltage sensor is designed for sensing the voltage when the switching element is opened. At the point in time when the switching element is opened on the primary side of the flyback-converter transformer, the transient reactions of the closing operation have already died off and a stationary state has set in. When voltage is measured at this point in time, an adverse effect caused by transient reactions is therefore ruled out.

According to one embodiment, the device further includes a peak value rectifier which is designed for rectifying a voltage on the secondary side of the flyback-converter transformer. In this case, the voltage sensor senses the rectified voltage on the secondary side of the flyback-converter transformer.

Preferably, the peak value rectifier rectifies the voltage on the secondary side of the flyback-converter transformer when the switching element has been closed at least for a predetermined time period. In this manner, any switching overvoltages that occur can be suppressed in the output signal of the peak value rectifier immediately after the switching element has been switched on.

According to one embodiment, the device further includes an evaluating device which is designed for calculating a primary voltage using the sensed voltage and a transfer ratio of the flyback-converter transformer. The transfer ratio of the flyback-converter transformer is typically known or can be easily determined. Therefore, after the voltage has been sensed on the secondary side of the flyback-converter transformer, the voltage can be determined on the primary side.

According to a further embodiment, the step for sensing the secondary voltage on the secondary side of the flyback-converter transformer senses the secondary voltage when the switching element is closed.

According to a further aspect, the present invention provides an electric drive system having an electrical energy source, an electric machine, a current converter, which is fed by the electrical energy source and is designed for actuating the electric machine, and a device according to the invention for determining a voltage, wherein the flyback converter of the device according to the invention for determining a voltage is coupled to the electrical energy source or an intermediate circuit of the current converter.

BRIEF DESCRIPTION OF THE DRAWINGS

Further embodiments and advantages of the present invention result from the following description with reference to the attached drawings. In the drawings.

DETAILED DESCRIPTION

Figure 1:
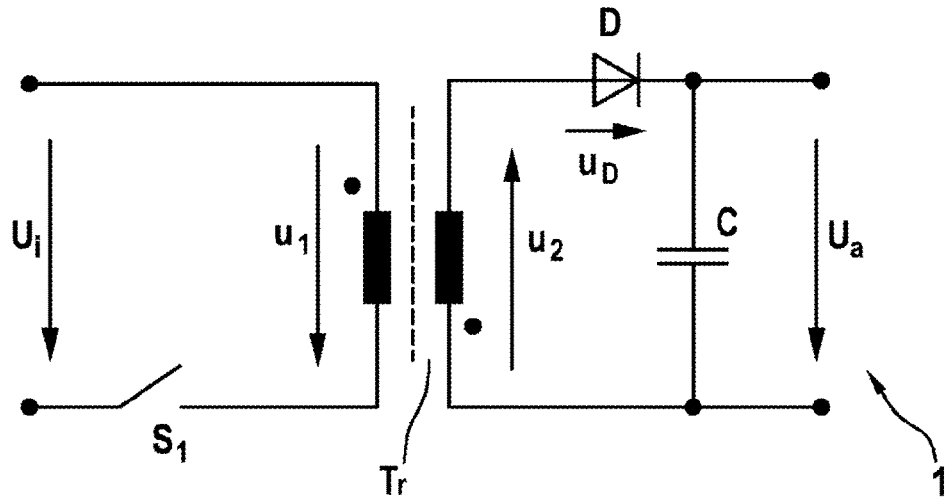
FIG. 1 shows a schematic representation of a simplified diagram of a flyback converter.

FIG. 1 shows a schematic representation of a wiring diagram for a flyback converter. The flyback converter includes a flyback-converter transformer Tr having a defined transmission ratio ü. The primary side of the flyback-converter transformer Tr can be connected to a DC voltage source via a switching element S1. The represented inductance $L_P$ and the capacitance $C_P$ are parasitic inductances and capacitances which are necessarily present in a real flyback converter. The secondary side of the flyback-converter transformer Tr is connected via a diode D to a capacitor C which is arranged parallel to the output terminals of the flyback converter. By specifically opening and closing the switching element S1, a DC voltage, which is typically lower than the input voltage of the flyback converter, can be provided in the output terminals parallel to the capacitance C. Due to the use of a suitable control process (not represented here), it is possible to always provide an at least approximately constant output voltage at the flyback converter even in the event of fluctuating input voltage of the flyback converter. In the case of a conventional voltage converter, therefore, the input voltage that is applied cannot be inferred from the output voltage that is provided.

Figure 2:
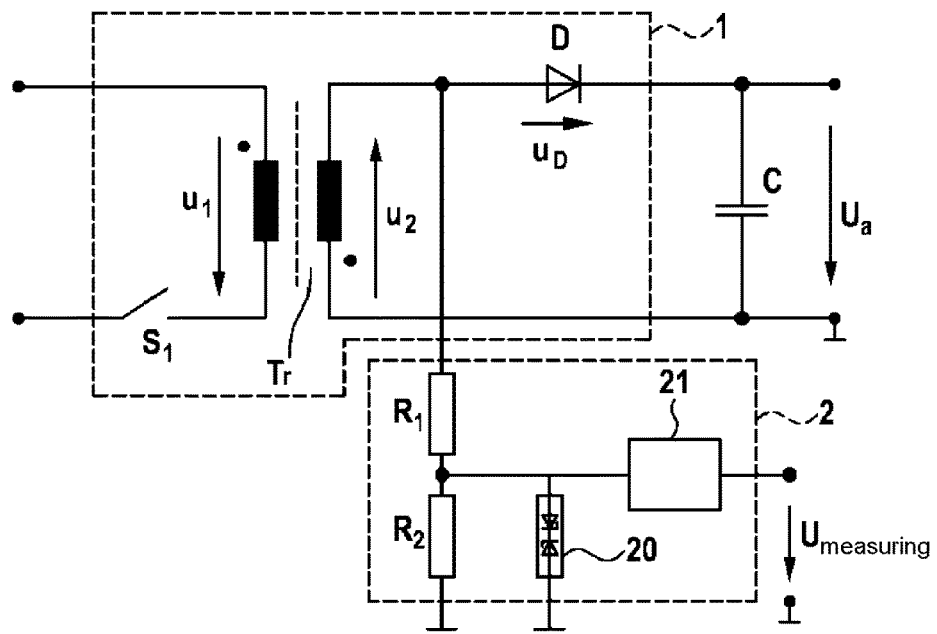
FIG. 2 shows a schematic representation of a device for determining a voltage according to one exemplary embodiment.

FIG. 2 shows a schematic representation of a simplified diagram of a device for determining a voltage according to one exemplary embodiment. The device for determining a voltage includes, in this case, an above-described flyback converter 1 having a flyback-converter transformer Tr and a switching element S1. A terminal on the secondary side of the flyback-converter transformer Tr is connected to a reference potential in this case. Another terminal on the secondary side of the flyback-converter transformer Tr is connected to a voltage sensor 2. In this case, the voltage sensor 2 can include, for example, a voltage divider comprising the two resistors R1 and R2. In this manner, the voltage on the secondary side of the flyback-converter transformer Tr can be reduced to a voltage level which is suitable for the further processing. Furthermore, the voltage sensor 2 can include a surge protection 20. For example, the surge protection 20 can include one or more suppressor diodes or Zener diodes. Alternative devices for surge protection are also possible, of course.

The detected voltage signal, which was further reduced, if necessary, by the voltage divider comprising the two resistors R1 and R2, is fed to a detection device 21. This detection device 21 converts the detected voltage signal into an analog or digital measuring signal and makes it available for the further evaluation or conditioning. The voltage is not sensed continuously, but rather only at predetermined points in time. These predetermined points in time are dependent on the switching state of the switching element S1 on the primary side of the flyback-converter transformer Tr in this case.

Figure 3:
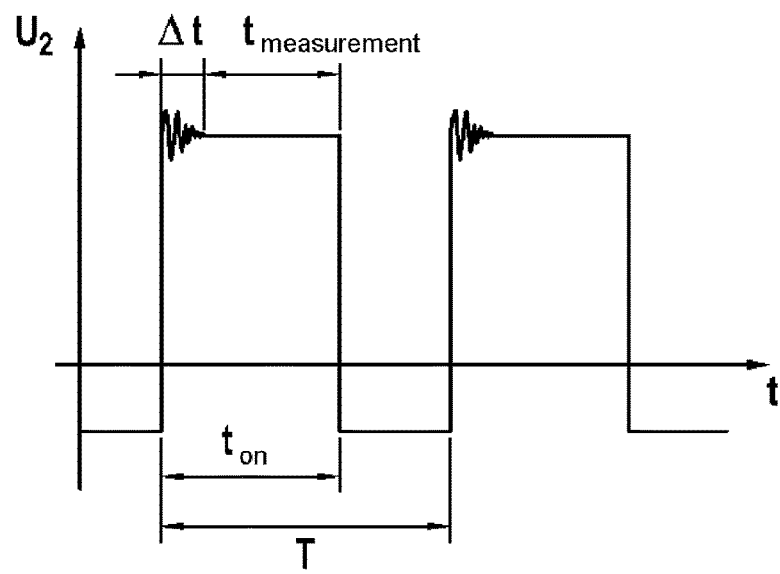
FIG. 3 shows a schematic representation of a voltage-time diagram for a voltage waveform in a device for determining a voltage according to one exemplary embodiment.

FIG. 3 shows a voltage-time diagram of the voltage u2 between the two terminals on the secondary side of the flyback-converter transformer Tr. If the switching element S1 is actuated and therefore closed, the full input voltage $U_i$ is present on the primary side of the flyback-converter transformer Tr. When a transfer ratio ü of the flyback-converter transformer Tr is known, the voltage u2,on results on the secondary side, as follows:

$$u2,\text{on}=U_i/ü.$$

If the switching element S1 has not been actuated, however, and is therefore open, the output voltage $U_a$ plus the on-state voltage of the diode D is present on the secondary side of the flyback-converter transformer Tr, provided the dimensions of the capacitor C are sufficiently great. The output voltage u2,off therefore results, as follows:

$$u2,\text{off}=-(U_a+u_D).$$

If the switching element S1 has been actuated and, therefore, closed, the voltage $U_i$ at the input of the flyback converter 1 can be calculated from the transfer ratio ü and the voltage u2, on, as follows:

$$U_i=u2,\text{on}·ü.$$

Due to the parasitic capacitance $C_P$ and inductance $L_P$ represented in FIG. 1, for example, when the switching element S1 is switched on, a transient reaction first occurs on the secondary side of the flyback-converter transformer Tr. The duration of this transient reaction is labeled with Δt in FIG. 3.

As soon as the transient reaction has died out, the input voltage $U_i$ can be inferred from the sensed voltage u2 on the secondary side of the flyback-converter transformer until the switching element S1 is opened again. During this duration $t_{measurement}$, the detection device 21 can sample the voltage u2, which is sensed via the voltage divider, on the secondary side of the flyback-converter transformer Tr with a sampling rate which is substantially higher than the switching frequency with which the switching element S1 is actuated. Preferably, the sampling rate of the detection device 21 can be higher, by two orders of magnitudes or more, than the switching frequency with which the switching element S1 is actuated.

In order to detect the duration during which the switching element S1 is actuated, i.e., closed, the control signal for actuating the switching element S1 also can be provided in parallel, for example, at the detection device 21. Alternatively, it is also possible that the detection device 21 continuously detects sensed voltage and, on the basis of a rising flank of the voltage waveform, can infer that the switching element S1 has been switched on. In an analogous manner, the detection device 21 can infer, on the basis of a falling flank in the voltage waveform, that the switching element S1 has been switched off. In order to determine the input voltage $U_i$ on the input side of the flyback converter in this case, only those detected voltage values are taken into account by the detection device 21 that are detected within a duration during which the switching element S1 is closed. Preferably, the detection device 21 only takes voltage values into account for which a predetermined duration has passed after the switching element S1 has been switched on, i.e., after a rising flank in the determined voltage waveform has been detected. In this manner, interferences that may arise during a transient reaction can be ruled out.

In order to further optimize the detected voltage values, the voltage values detected by the detection device 21 can also be filtered, for example, by means of a digital filter. Further preparations of the detected voltage values are also possible.

Subsequently, the detection device 21 can convert the detected voltage values directly into an analog or digital signal and make this signal available. Alternatively, when a transfer ratio ü of the flyback-converter transformer Tr is known and with consideration for the divider ratio of the two resistors R1 and R2 of the voltage divider, the detection device 21 can calculate the value of the voltage at the input of the flyback converter and output an analog or digital signal corresponding to this value. The output can take place, for example, in the form of a bus message via a communication bus.

Figure 4:
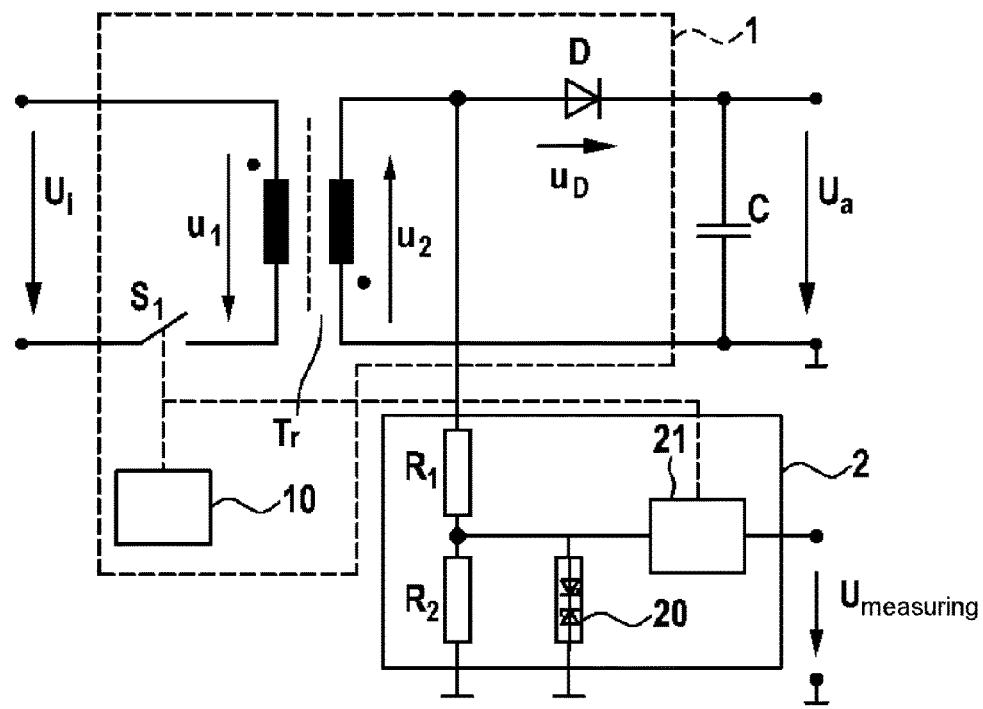
FIG. 4 shows a schematic representation of a simplified diagram of a device for determining a voltage according to a further exemplary embodiment.

FIG. 4 shows a schematic representation of a simplified diagram which forms the basis for a device for sensing a voltage according to a further exemplary embodiment. The design substantially corresponds to the design of the device for sensing a voltage according to FIG. 2. Since interruptions can occur in the voltage signal of the voltage u2 on the secondary side of the flyback-converter transformer Tr during the transient reaction when the switching element S1 is switched on, in this exemplary embodiment, the voltage u2 on the secondary side of the flyback-converter transformer Tr is sensed precisely at the point in time at which the control signal of the switching element S1 opens the switching element S1. In this case, full advantage is taken of the fact that a delay occurs between the output of this control signal and the actual opening of the switching element S1. In order to extend this delay, the switching element S1 can include an additional capacitor C1 (e.g., between a gate terminal and a source terminal of a MOSFET).

As represented in FIG. 4, the control signal for the switching element S1 is provided by a controller 10 simultaneously at the switching element S1 and the detection device 21. In this case, the detection device 21 senses the voltage u2 on the secondary side of the flyback-converter transformer Tr at the point in time at which the controller 10 opens the switching element S1. Due to the above-described delay, the detection device 21 can still sense the full voltage u2 on the secondary side of the flyback-converter transformer Tr at this point in time. Since this point in time occurs at the end of the switch-on phase of the switching element S1, however, a possible transient reaction has already sufficiently died out at this point in time and the measuring result is not corrupted by the transient reaction.

Figure 5:
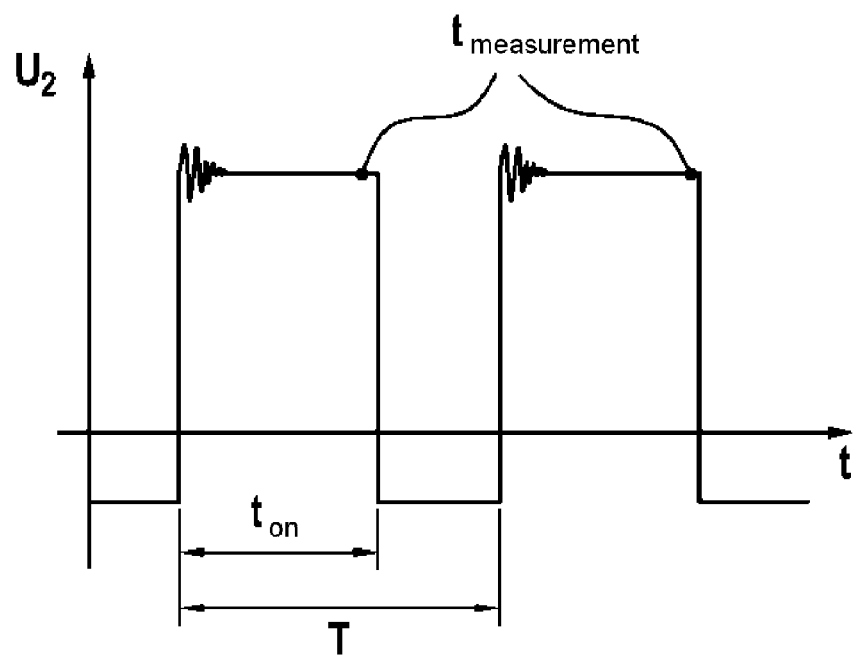
FIG. 5 shows a schematic representation of a voltage-time diagram for a voltage waveform in a device for determining a voltage according to a further exemplary embodiment.

FIG. 5 shows a schematic representation of a voltage-time diagram of the voltage waveform on the secondary side of the flyback-converter transformer Tr. The points in time at which the detection device 21 senses the voltage on the secondary side of the flyback-converter transformer Tr are labeled with $t_{measurement}$ in this case.

Figure 6:
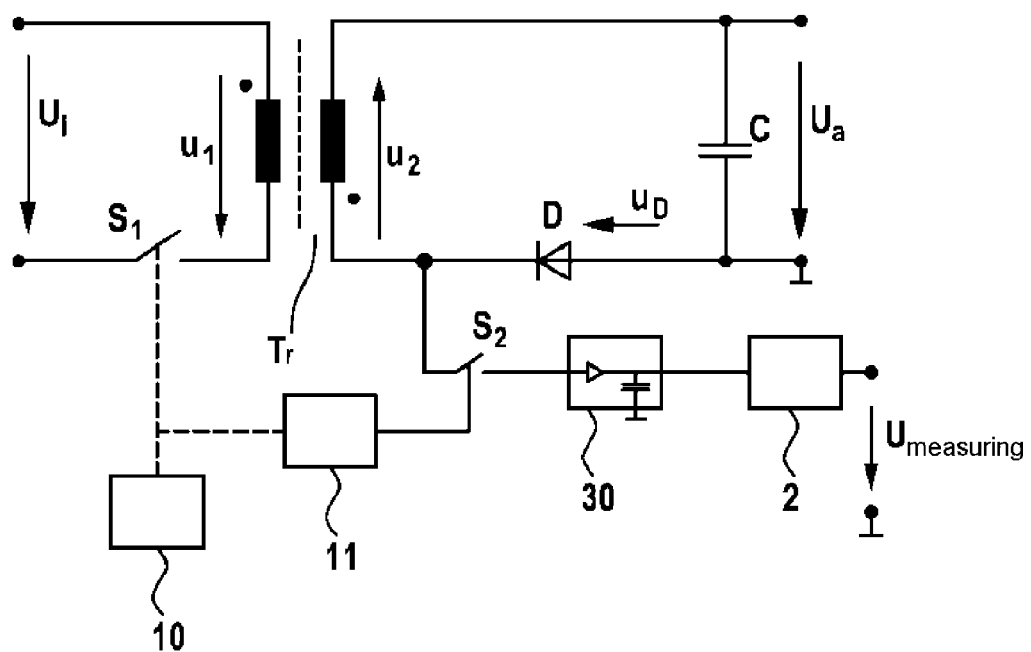
FIG. 6 shows a schematic representation of a simplified diagram of a device for determining a voltage according to yet another exemplary embodiment.

FIG. 6 shows a schematic representation of a simplified diagram which forms the basis for a further embodiment of a device for sensing a voltage. The secondary-side rectifier diode D is arranged, in this case, in the ground line between a reference potential and a terminal on the secondary side of the flyback-converter transformer Tr. The other terminal on the secondary side of the flyback-converter transformer Tr is connected to the secondary-side output of the flyback converter 1. The electric node between the diode D and the terminal of the flyback-converter transformer Tr connected to this diode D is connected to the voltage sensor 2 via a switching element S2 and a peak value rectifier 30. The switching element S2 between the flyback-converter transformer and the peak value rectifier 30 can be actuated in this case depending on the switching state of the switching element S1 on the primary side of the flyback converter 1. If the electrical connection between the secondary side of the flyback-converter transformer Tr and the peak value rectifier 30 is first closed via the interposed switching element S2 when any switching overvoltages that may have occurred have died out, interferences in the output signal of the peak value rectifier 30 caused by these switching overvoltages can be suppressed. The delay time required for this can be increased, if necessary, by means of a capacitor between the input and the output of the switching element S2, which capacitor is not shown here. Additionally or alternatively, the switching action of the switching element S2 can also be delayed by a delay element 11 between the controller 10 and the switching element S2.

Whereas, in the embodiments according to FIG. 2 and FIG. 4, the voltage sensor 2 senses a voltage which is below the reference potential, in the exemplary embodiment according to FIG. 6, a positive measuring voltage $U_{measuring}$ can be sampled at the anode of the diode D. This measuring voltage corresponds to the output voltage Ua and the transformed input voltage $U_i$:

$$U_{measuring} = U_a + (U_i/\ddot{u}) - U_D.$$

This voltage can be measured using the peak value rectifier 30, wherein, in the simplest case, the forward voltage $u_D$ of the diode must also be taken into account. If both u2 and the measuring voltage $U_{measuring}$ are known, the input voltage $U_i$ of the flyback converter can also be inferred therefrom.

Figure 7:
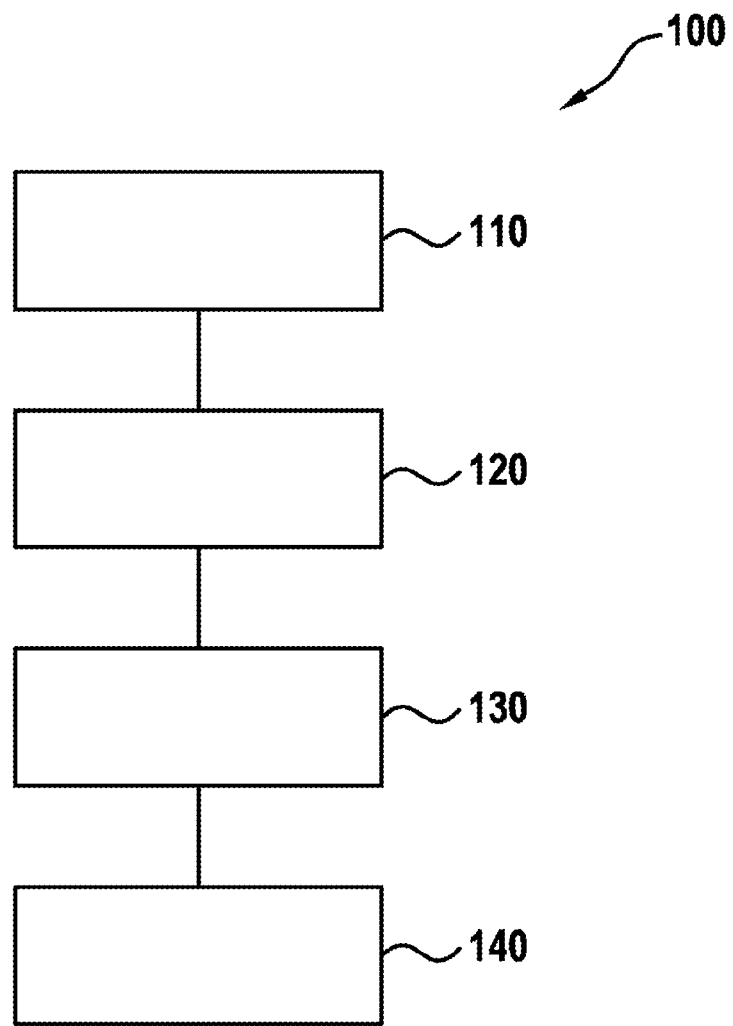
FIG. 7 shows a schematic representation of a flow chart which forms the basis for a method for determining a voltage according to one exemplary embodiment.

FIG. 7 shows a schematic representation of a flow chart which forms the basis for a method 100 for determining a voltage.

In step 110, first a flyback converter 1 having a flyback-converter transformer Tr and a switching element S1 are provided. The flyback-converter transformer Tr has a primary side and a secondary side. The switching element S1 of this flyback converter 1 is arranged on the primary side of the flyback-converter transformer Tr.

In step 120, the provided switching element is activated. In step 130, a secondary voltage u2 is sensed on the secondary side of the flyback-converter transformer Tr. Next, in step 140, a primary voltage is calculated, which corresponds to a voltage on the primary side of the flyback-converter transformer Tr. The primary voltage is calculated on the basis of the sensed secondary voltage u2.

In this case, as described above, the step 130 for sensing the secondary voltage u2 senses the secondary voltage u2 when the switching element S1 on the primary side of the flyback-converter transformer Tr is closed. The sensing of the secondary voltage u2 can also first begin when a predetermined duration has passed since the switching element S1 was closed. Preferably, the secondary voltage u2 can also be first sensed when the switching element S1 already receives a control signal to open the switching element. Due to the delay in the opening of the switching element, the correct secondary voltage can still be sensed at this point in time.

The above-described device and the method for determining a voltage are particularly suited for sensing a voltage in an electric drive system. An electric drive system of this type is fed by an electrical energy source, for example, a battery. Such a battery can be, for example, a traction battery in an electrically driven motor vehicle. The electric drive system can further comprise an electric machine. The electric machine is actuated by an electric current converter having an intermediate circuit, wherein the current converter is fed by the electrical energy source. In this case, the flyback converter of the device according to the invention for determining a voltage is coupled, for example, to the electrical energy source or to the intermediate circuit of the current converter.

In summary, the present invention relates to a device and a method for determining a voltage. The voltage to be determined is a direct voltage at the input of a flyback converter. The flyback converter comprises at least one flyback-converter transformer and a switching element on the primary side of the flyback-converter transformer. In order to determine the voltage at the input of the flyback converter, a voltage on the secondary side of the flyback-converter transformer is sensed and evaluated depending on the switching state of the switching element on the primary side.

The invention claimed is:

1. A device for determining a voltage, comprising:
   a flyback converter (1), which includes a flyback-converter transformer (Tr) and a switching element (S1); and
   a voltage sensor (2);
   wherein the flyback-converter transformer (Tr) has a primary side and a secondary side;
   the switching element (S1) is arranged on the primary side of the flyback-converter transformer (Tr); and
   the voltage sensor (2) is arranged on the secondary side of the flyback-converter transformer (Tr) and is configured to sense a voltage depending on a switching state of the switching element (S1);
   wherein the voltage sensor (2) senses the voltage at a predetermined time following closure of the switching element (S1).

2. The device as claimed in claim 1, wherein the voltage sensor (2) is configured to sense the voltage when the switching element (S1) is opened.

3. The device as claimed in claim 1, comprising a peak value rectifier (30) configured to rectify a voltage on the secondary side of the flyback-converter transformer (Tr), wherein the voltage sensor (2) senses the rectified voltage.

4. The device as claimed in claim 3, wherein the peak value rectifier (30) rectifies the voltage on the secondary side of the flyback-converter transformer (Tr) when the switching element (S1) has been closed at least for a predetermined time period.

5. The device as claimed in claim 1, comprising an evaluating device (21) which configured to calculate a primary voltage using the sensed voltage and a transfer ratio of the flyback-converter transformer (Tr).

6. An electric drive system, comprising:
   an electric energy source;
   an electric machine; and
   a current converter which is fed by the electric energy source and is configured to actuate the electric machine; and a device for determining an electric voltage as claimed in claim 1,
   wherein the flyback converter (1) of the device for determining a voltage is coupled to the electrical energy source.

7. An electric drive system, comprising: an electric energy source;
   an electric machine; and
   a current converter which is fed by the electric energy source and is configured to actuate the electric machine; and a device for determining an electric voltage as claimed in claim 1,
   wherein the flyback converter (1) of the device for determining a voltage is coupled to an intermediate circuit of the current converter.

8. A method (100) for determining a voltage, including the steps:
   providing (110) a flyback converter (1) comprising a flyback-converter transformer (Tr) and a first switching element (S1), wherein the flyback-converter transformer (Tr) has a primary side and a secondary side, and the switching element (S1) is arranged on the primary side of the flyback-converter transformer (Tr);
   actuating (120) the first switching element (S1);
   sensing (130) a secondary voltage on the secondary side of the flyback-converter transformer (Tr) at a predetermined time following closure of the switching element (S1); and
   calculating (140) a primary voltage which corresponds to an electric voltage on the primary side of the flyback-converter transformer (Tr) using the sensed secondary voltage.

9. The method as claimed in claim 8, wherein the step (130) for sensing the secondary voltage senses the secondary voltage when the switching element (S1) is closed.

* * * * *